United States Patent [19]

Smithers

[11] Patent Number: 4,631,491
[45] Date of Patent: Dec. 23, 1986

[54] BIPOLAR TRANSISTOR RF POWER AMPLIFIER

[75] Inventor: Colin R. Smithers, Sutton, England

[73] Assignee: U.S. Philips Corporation, New York, N.Y.

[21] Appl. No.: 755,635

[22] Filed: Jul. 16, 1985

[30] Foreign Application Priority Data

Aug. 17, 1984 [GB] United Kingdom ............... 8420934

[51] Int. Cl.⁴ .......................... H03F 1/30; H03F 3/24
[52] U.S. Cl. .................................. 330/149; 330/129; 330/279; 328/155; 328/175
[58] Field of Search .............. 328/155, 162, 168, 175; 330/129, 136, 149, 279, 290; 455/126, 127

[56] References Cited

U.S. PATENT DOCUMENTS

3,668,533  6/1972  Fish et al. ..................... 328/175 X
3,900,823  8/1975  Sokal et al. .................... 330/149
4,547,746  10/1985 Erickson et al. ............... 330/129 X Primary Examiner—Eugene R. LaRoche
Assistant Examiner—Steven J. Mottola
Attorney, Agent, or Firm—Thomas A. Briody; William J. Streeter; Marianne R. Rich

[57] ABSTRACT

A bipolar transistor R.F. power amplifier in which feedback is used to control simultaneously amplitude and phase distortion. The power amplifier is operated by determining a set of collector supply voltages located at the onset of gain saturation in the bipolar transistor and using feedback to adjust the collector supply voltage in response to variation in input drive level to operate the bipolar transistor in a mode where gain, phase shift and input impedance are simultaneously linearized, found at the onset of gain saturation.

3 Claims, 12 Drawing Figures

BIPOLAR TRANSISTOR RF POWER AMPLIFIER

The present invention relates to a bipolar transistor RF power amplifier.

RF power amplifier linearity is of great importance in communications when amplifying non-constant envelope signals such as SSB speech or certain types of data. Distortions of signal envelope and phase result in the production of intermodulation products in the adjacent channels which cannot be filtered out by conventional means. In power budget and heat dissipation limited situations it is conventional to use bipolar transistors in the so-called class - AB mode, where small signals are amplified in their entirety while larger signals move progressively into class B where the active device is accepted to be conducting for only a portion of the RF, the waveform being completed by the ringing effect of the output matching network. In conventional RF power amplifiers there are two main forms of distortion which are recognised to be of importance, these forms of distortion are (1) non-linearity of amplitude transfer characteristic and (2) amplitude modulation (AM) to phase sodulation (PM) conversion hereinafter referred to as AM-PM conversion (either linear or non-linear). In the case of non-constant amplitude waveforms such as SSB speech and certain types of data modulation, these distortions both cause intermodulation frequency products which are located immediately adjacent to the wanted signals and thus cannot be filtered out. The presence of such intermodulation products causes the transmission to spread into adjacent channels. Accordingly it is desirable to avoid this problem by not generating the intermodulation products in the first place.

The present invention is primarily concerned with an R.F. power amplifier operating in narrow band. By narrow band is meant that the even order intermodulation products have frequencies somewhere near those of the harmonics, both of which can be taken care of by filtering. However this leaves the odd order intermodulation products which occur adjacent to the band of signals.

According to one aspect of the present invention there is provided a method of operating a bipolar transistor R.F. power amplifier, comprising determining a set of collector supply voltages located at the onset of gain saturation in the bipolar transistor and using feedback to adjust said collector supply voltage in response to variation in input drive level to operate the bipolar transistor in a mode wherein gain, phase shift and input impedance are simultaneously linearised, found at the onset of gain saturation.

The operation of the R.F. power amplifier made in accordance with the present invention is based on the recognition of the fact that with bipolar transistor power amplifiers if as the input drive level is reduced, the collector supply voltage is reduced in a precise manner also, there is a significant reduction in distortion due to non-linearity of amplitude transfer characteristic and to AM-PM conversion.

The feedback signal may be derived from envelope or phase differences. The use of envelope feedback to provide a power output control signal which is applied to an R.F. power amplifier is disclosed in FIGS. 1 and 2 of U.S. Pat. No. 3,900,823. This specification at column 5 lines 20 to 24 effectively says that the difference between the amplitude detected input and attenuated output signals is employed by a power output control means to vary the output amplitude of the R.F. power amplifier in such a way as to cause it to be directly proportional to the amplitude of the input R.F. signal. However this passage does not elaborate on the exact nature of how the corrections are made. Furthermore the patentees of U.S. Pat. No. 3,900,823 are silent about simultaneously controlling amplitude and phase distortion.

British Patent Specification No. 1005073 discloses the use of amplitude detectors for controlling the linearity of an up-converter. The amplitude detectors sense the input signal to, and the output signal from, the up-converter and any difference is applied to an amplitude modulator coupled to the input of the up-converter. This specification seeks to solve a different problem to that solved by the present invention.

If desired the feedback coefficient may be adjusted in response to the variation of the reflection coefficient at the amplifier input. Observing, in FIGS. 6 and 7 of the accompanying drawings, the well defined maximum of the input reflection coefficient and the corresponding very abrupt 180° phase change, use may be made of this as an extra control signal to adjust the feedback coefficient. Such an adjustment of the feedback coefficient in combination with the envelope or phase feedback enables the collector voltage of the bipolar transistor to be adjusted to maintain against thermal, component and other drifts the optimum voltage conditions for simultaneously maximising the amplitude and phase linearities at any given instantaneous signal level, as well as improving the efficiency and the constancy of the input impedance match over the full power range.

According to another aspect of the present invention there is provided a bipolar transistor R.F. power amplifier comprising an adjustable collector voltage power supply, means for deriving a characteristic of the input signal, means for deriving the same type of characteristic of the output signal, and comparator means for comparing the corresponding characteristics of the input and output signals and providing a feedback control signal to the collector voltage power supply, wherein the collector voltage power supply is adapted to adjust said collector supply voltage so that the bipolar transistor operates in a mode where gain, phase shift and input impedance are simultaneously linearised, found at the onset of gain saturation in response to variations in input drive level.

In an embodiment of the present invention in which the feedback coefficient is adjusted, means are provided for sensing the magnitude and sign of the amplifier input reflections and further means are provided for deriving a control signal in response to the reflections sensed, the control signal being used to adapt the feedback conditions of the amplifier.

In an embodiment of the R.F. power amplifier made in accordance with the present invention in which envelope feedback is used, diode detectors are coupled to the input and attenuated output circuits of the bipolar transistor, outputs of the diode detectors are coupled to an amplifier whose output comprises the difference of the signals applied to the detectors. A collector voltage power supply unit is connected to the amplifier output to control the collector voltage in response to differences between the detected voltages. The efficiency of the amplifier is improved significantly if a high efficiency power supply such as a switched mode power supply is used.

The present invention also provides a method of operating a bipolar transistor R.F. power amplifier, characterised by monitoring the reflection coefficient at the amplifier input and adjusting the collector supply voltage in response to the monitored reflection coefficient to maintain a substantially constant input impedance match over the full power range of the amplifier.

The present invention further provides a bipolar transistor R.F. power amplifier characterised by an adjustable collector voltage power supply, means for sensing the magnitude and sign of the amplifier input reflections, means for deriving a control signal in response to the sensed amplifier input reflections, said control signal being applied to the collector voltage power supply which in response thereto adjusts the collector voltage in a manner to maintain a substantially constant input impedance over the full power range of the amplifier.

The present invention will now be described, by way of example, with reference to the accompanying drawings, wherein:

FIG. 4 is a contour diagram of FIG. 3, FIGS. 5a and 5b are block schematic diagrams of two alternative embodiments of an R.F. power amplifier made in accordance with the present invention.

Figure 1:
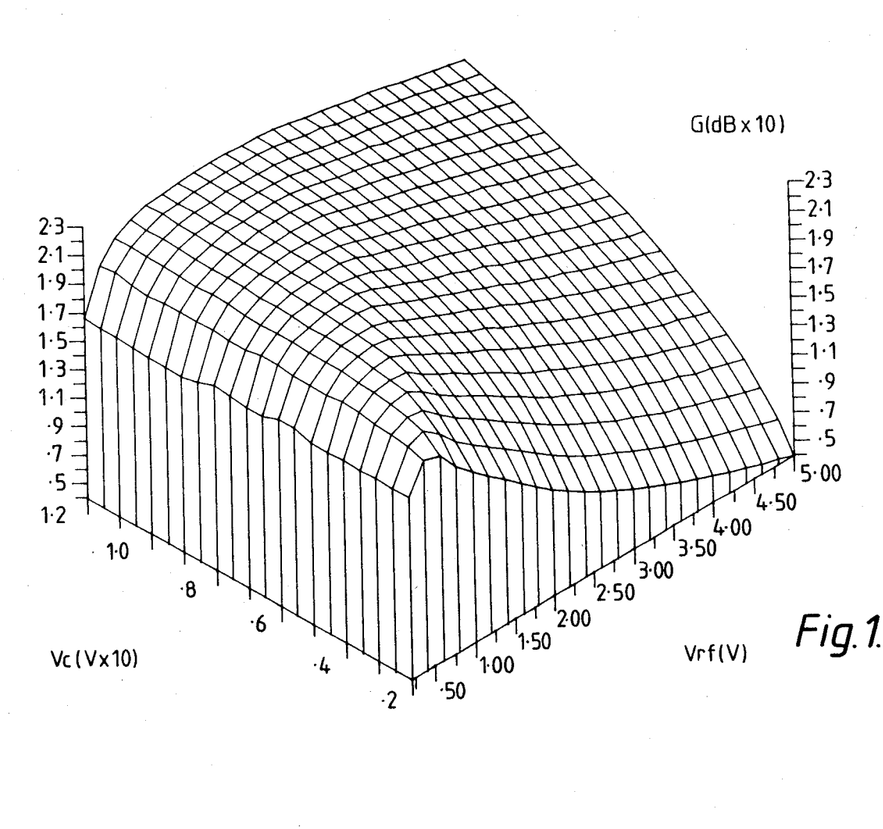
FIG. 1 is a plot made by a computerised automatic test system showing the amplifier gain (G) variation with collector supply voltage (Vc) and R.F. drive voltage (Vrf), the bias conditions being fixed.
Figure 2:
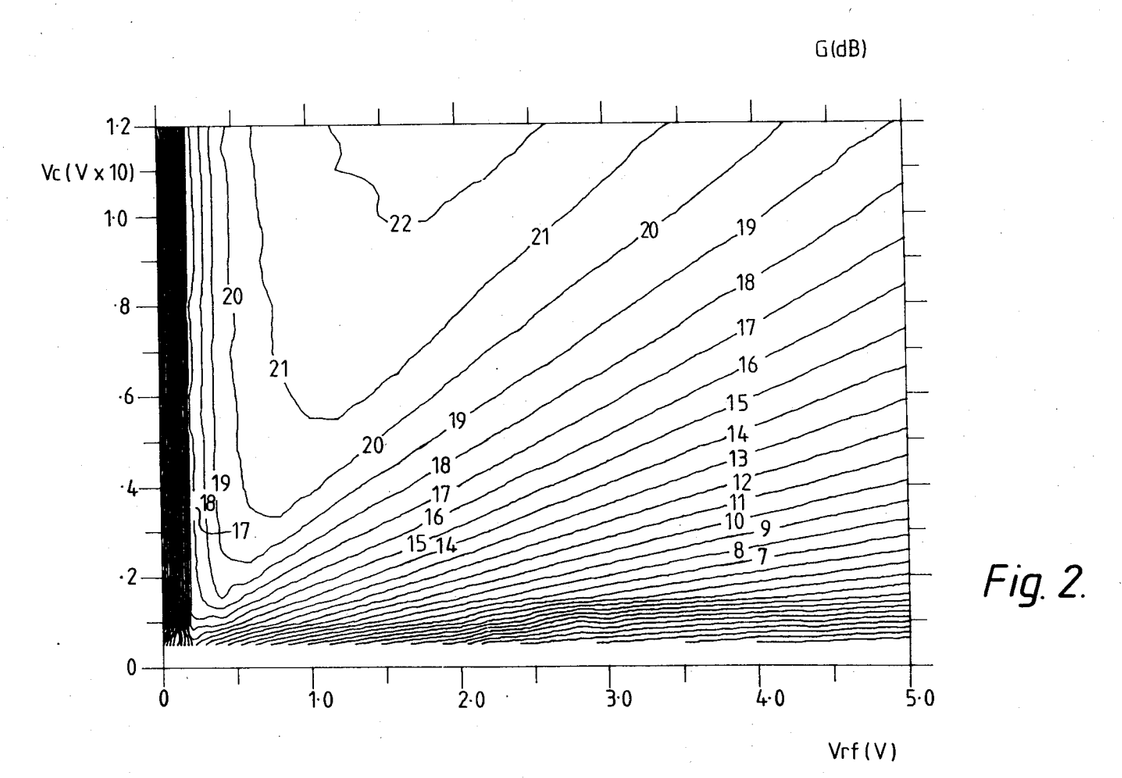
FIG. 2 is a contour diagram of FIG. 1.
Figure 3:
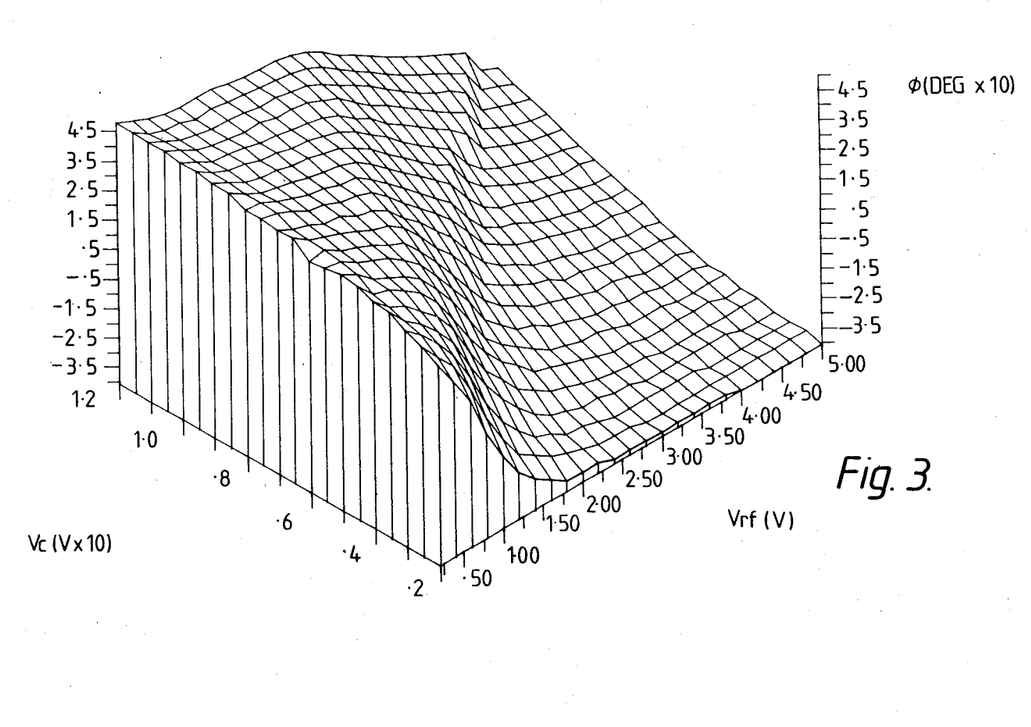
FIG. 3 is another plot showing phase ($\phi$) variation with collector supply voltage (Vc) and R.F. drive voltage (Vrf), the bias conditions being fixed.
Figure 4:
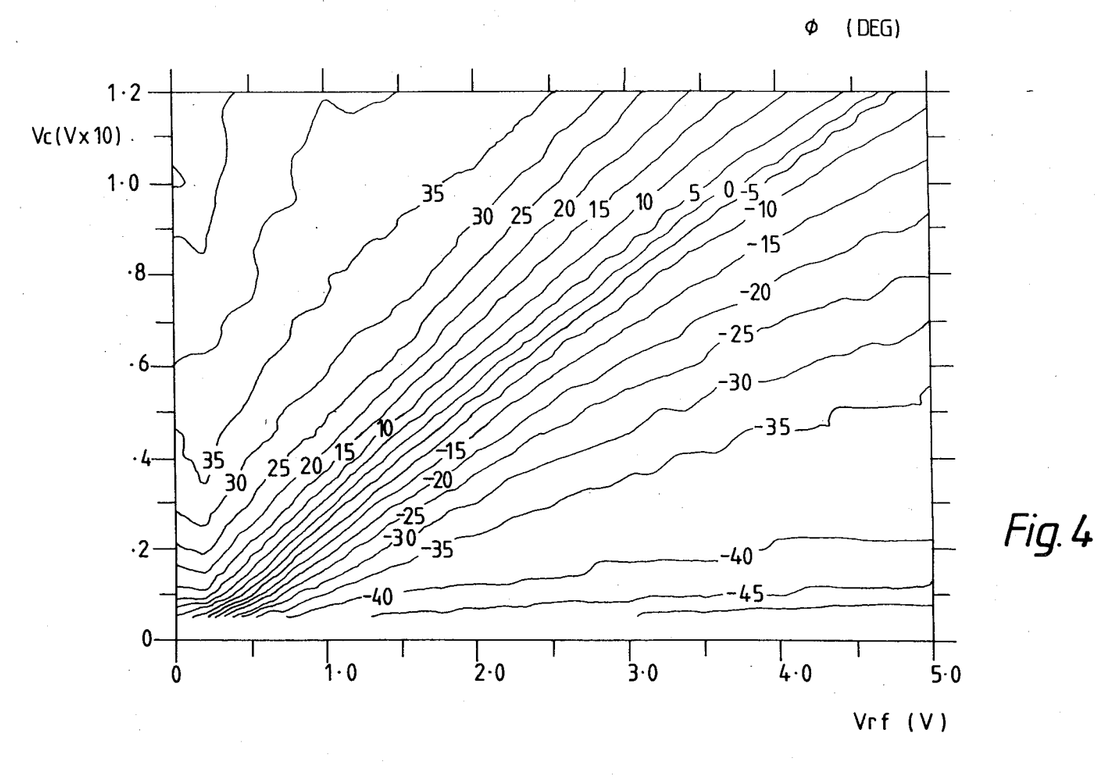

Referring to the drawings, FIGS. 1 and 3 show respectively the amplifier gain, G, and phase variation, $\phi$, with collector supply voltage, Vc, and R.F. drive voltage Vrf, with bias conditions fixed, of an R.F. bipolar transistor power amplifier not having envelope feedback. An examination of these curves indicates that with reducing the collector supply voltage the saturated gain point (FIG. 1) and the turning point in the phase curve (FIG. 3) both reduce with respect to the drive voltage. Further examination of FIGS. 1 and 3 and their associated contour diagrams, FIGS. 2 and 4, reveal that it is possible to isolate a set of collector supply voltages which, when correctly chosen for a given drive amplitude, optimise coincidentally improvements in phase linearity, gain linearity, input impedance linearity and amplifier efficiency. This isolated set of collector supply voltages is located at the onset of gain saturation and may be regarded as a form of amplifier class maintenance. As the improvements in gain and phase coincide, the bipolar transistor R.F. power amplifier made in accordance with the present invention uses phase error or amplitude error as the means for adjusting the collector supply voltage.

Figure 5:
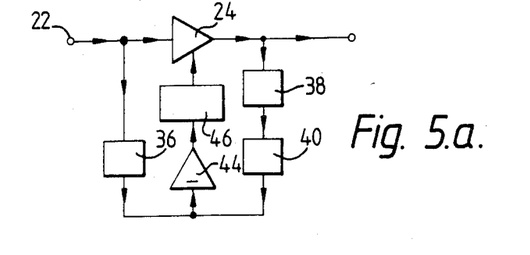

FIG. 5a is a block schematic circuit diagram of a first embodiment of the present invention in which envelope feedback is used to provide the signal for adjusting the collector supply voltage of a bipolar transistor R.F. power amplifier 24. A signal input terminal 22 is connected to an input of the amplifier 24. An envelope feedback signal is derived from the input and output of the amplifier 24. In this embodiment opposite polarised diode detectors 36, 40 are used, the outputs of which detectors 36, 40 are summed algebraically at the input of an amplifier 44. The signal output of the amplifier 44 is attenuated by the attenuator 38 before being applied to the detector 40. The output of the amplifier 44 acts as a control signal for a modulated power supply 46, such as a switched mode power supply. The output of the power supply 46 is used to adjust the collector voltage of the bipolar transistor circuit in the amplifier 24 in order to select the optimum voltage for simultaneously maximising the amplitude and phase linearities at any given instantaneous signal power level, as well as improving the linearity of the input impedance and the efficiency over the full power range.

Turning now to FIG. 5b and initially ignoring the components within the broken line box 25, this circuit differs from that shown in FIG. 5a in that the amplifier 44 is a differential amplifier and in consequence the diode detectors 36, 40 are similarly polarised.

Figure 6:
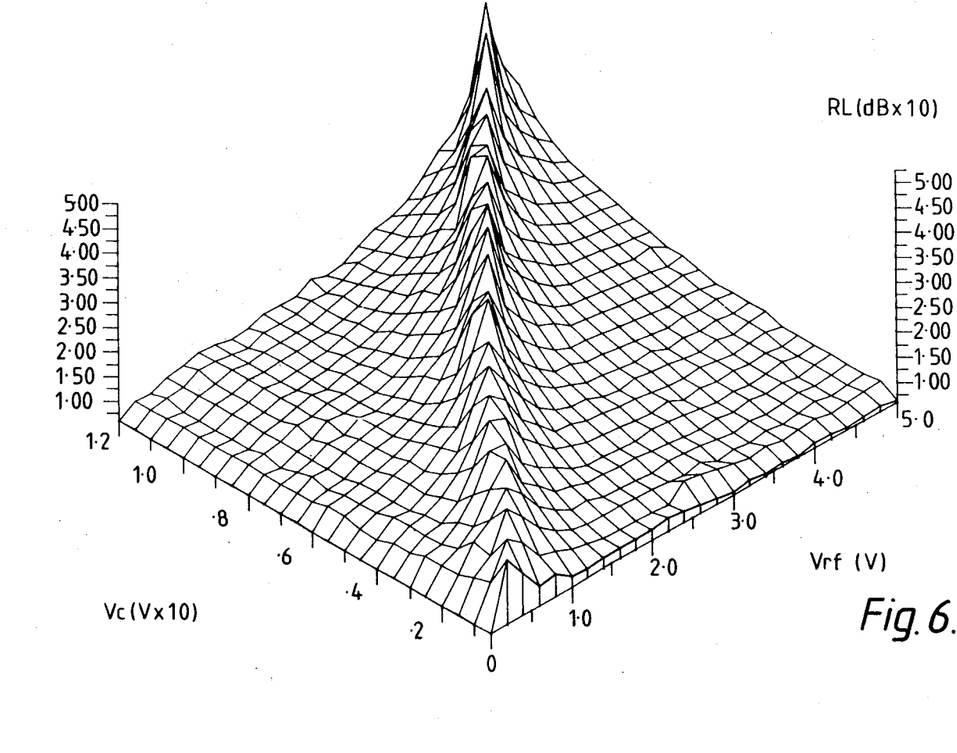
FIGS. 6 and 7 show respectively the variation in return loss (RL) at the input of the power amplifier and its relative return phase (R$\phi$) versus the collector supply voltage (Vc) and R.F. drive voltage (Vrf), with the bias conditions being fixed.
Figure 7:
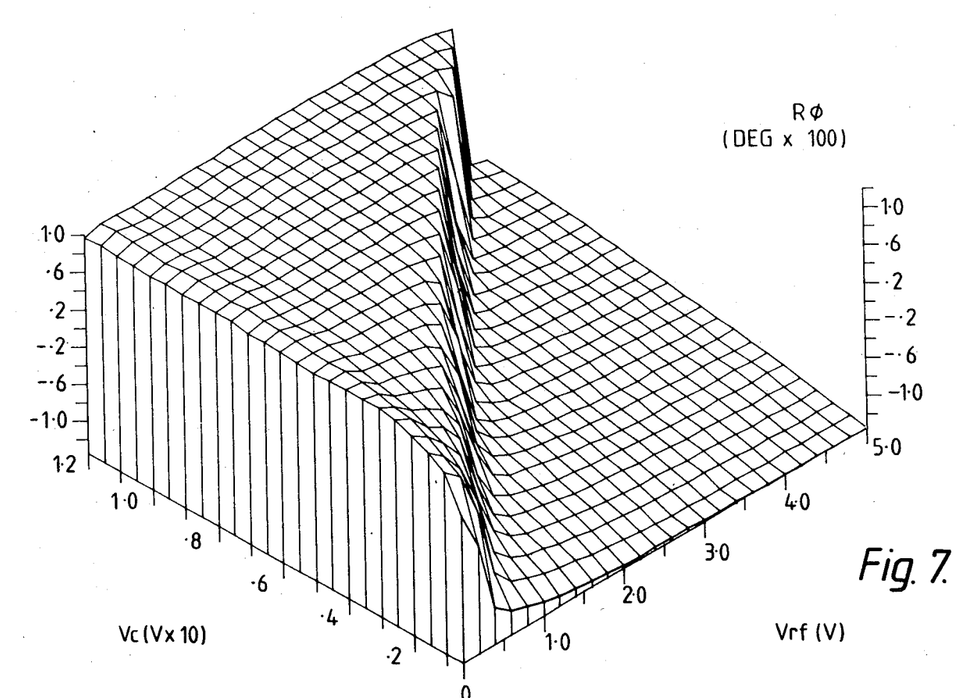

Referring to FIGS. 6 and 7 a well defined maximum of the input reflection coefficient and the very abrupt 180° phase change are observed and use may be made of these to provide an additional control signal to adjust the feedback coefficients of the amplifier system. With this in mind the components shown in the broken line box 25 enable the magnitude and sign of the amplifier input reflections to be sensed and for the additional control signal to be derived from the sensed input reflections, which signal is used to adapt the feedback conditions of the amplifier system to maintain a constancy of the input impedance match over the full power range. If desired the components in the box 25, can be used in the circuit of FIG. 5a.

Turning to the box 25, a directional coupler 20 is coupled between the input terminal 22 and an input to an R.F. power amplifier 24. The directional coupler 20 has a forward port 26 and a reflected port 28. The outputs of the ports 26, 28 are connected to a synchronous detector 30 whose output is applied to a low pass filter 32 the output from which comprises an additional control signal which is used to vary the resistance of an electrically controllable resistor 34 which may for example comprise a FET and in so doing vary the feedback coefficient. The electrically controllable resistor 34 and another resistor 42 are connected between the diode detectors 36, 40 and respective inputs to the amplifier 44.

In operation the forward coupled power on the port 26 is used as a reference signal in the synchronous detector 30 against which the reflected signal on the port 28 is compared. As the detector 30 is synchronous the sign of the detected voltage is maintained so that the additional control signal is proportional to the magnitude and the sign of the reflected wave from the amplifier 24.

In this application the directional coupler 20 acts as an impedance sensitive power coupler and operates by sampling the voltage and current in the line and combining these samples in the same ratio as the characteristic impedance of the line, the forward port being the sum of the samples and the reflected port being the difference of the samples. In function therefore, it senses the magnitude of the forward and reflected power, but only after a characteristic impedance has been defined for the system.

If desired the components in the box 25 can be used independently of the envelope feedback so that the input impedance match is maintained substantially constant to minimise the power reflected by the input impedance.

Figure 8:
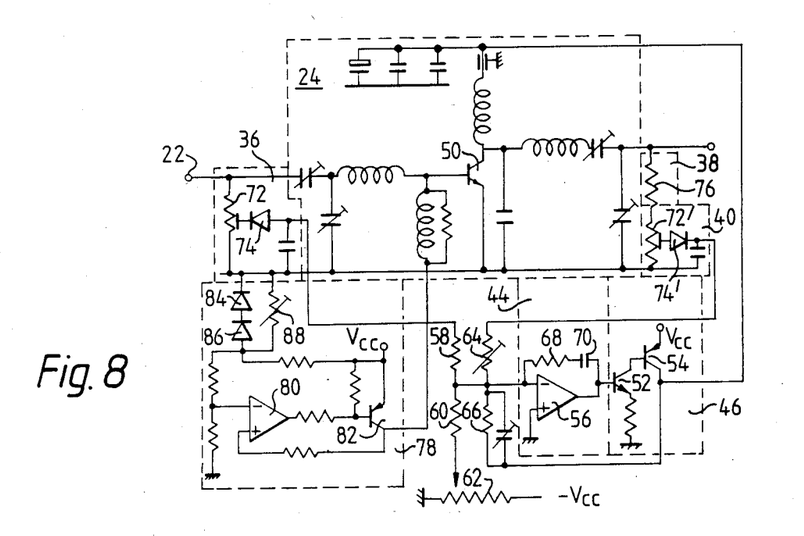
FIG. 8 is a schematic circuit diagram of the amplifier shown in FIG. 5A.

FIG. 8 shows the amplifier circuit of FIG. 5a in greater detail. For convenience the main circuit parts are enclosed in broken lines and each part bears the same reference numeral as shown in FIG. 5a. The R.F. power amplifier 24 comprises a bipolar transistor 50 of a type suited to the intended frequency of operation and may comprise a BLW 60 for high frequency operation and a BLW 31 for use at V.H.F. The collector circuit of the transistor 50 is coupled to the power supply circuit 46 formed by cascode connected complementary bipolar transistors 52, 54 of type BFX 85 and PNP 3055, respectively. The circuit 46 controls the collector voltage of the transistor 50 in response to an appropriate output from the amplifier 44. The amplifier 44, which is based on a type 741 operational amplifier 56, operates as a high gain inverting amplifier. The non-inverting input of the amplifier 56 is connected to earth whilst the inverting input is connected to a summing network comprised of resistors 58 (3K9), 60 (100KΩ) a presettable resistor 64 (10KΩ) and a resistor 66 (100KΩ). The outputs of the opposite polarised diode detectors 36, 40 are connected respectively to the resistors 58, 64. A quiescent collector voltage for the transistor 50 is set by a tapping of a potentiometer 62 connected between earth and $-V_{cc}$. The collector voltage as determined by the power supply 46 is fed back to the resistor 66. Under quiescent (no signal) conditions, the voltages on the resistors 60 and 66 are relevant but under non-quiescent conditions signal outputs from the detectors override the quiescent voltages to adjust the collector voltages accordingly.

The diode detectors 36, 40 are identical and are connected respectively to the input and output, via the attenuator 76, of the R.F. power amplifier 24. Each diode detector comprises a presettable resistor 72, 72' and a diode 74, 74' is connected to the tapping of the resistor 72, 72', respectively. The diodes 74, 74' are chosen to have a low onset voltage and may be a hot carrier type or germanium point contact type such as OA47. The attenuator 38 comprises a fixed value resistor 76 of value 3K3 connected in series with the resistor 72' across the amplifier output.

FIG. 8 also shows a thermally tracking bias supply 78 which is connected into the base circuit of the transistor 50. This circuit comprises a high gain inverting amplifier 80 based on a type 741 operational amplifier and a bipolar transistor 82 of a type BD 132 whose collector voltage is fed back to the non-inverting input of the amplifier 80. The inverting input is connected to two series connected diodes 84, 86 and a parallel arranged presettable resistor 88. The collector supply rail voltage $V_{cc}$ passes through the diodes to the emitter bias rail of the transistor 50. The diodes 84, 86 are thermally coupled to the transistor 50 so that they are substantially all at the same temperature.

Figure 9:
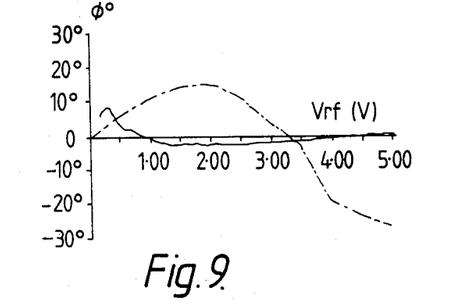
FIG. 9 is a graph showing the phase performance of the R.F. amplifier shown in FIG. 6 with and without envelope feedback.

Experimental amplifiers for operation at high frequency and VHF have been constructed using the appropriate bipolar transistor 50 and the improvement in phase, $\phi$, linearity obtained by using feedback (continuous line) compared to not using feedback (broken line) is shown in FIG. 9.

Figure 10:
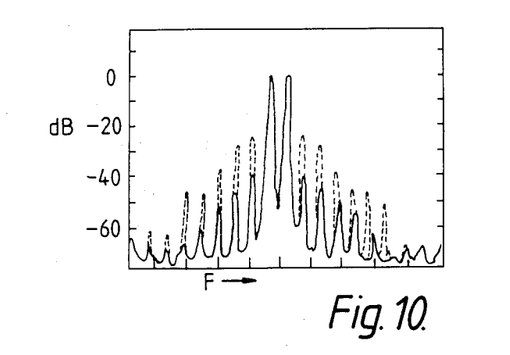
FIG. 10 shows the intermodulation product performance of a 29 MHz amplifier with and without envelope feedback.

FIG. 10 shows in full lines the typical intermodulation product performance of a two tone test on an R.F. power amplifier with feedback and in broken lines the performance without feedback. Reverting to the performance with feedback all the intermodulation products are more than $-40$ dB from either one of the two tones used in the test. A comparison of the two performance tests shows that with feedback the largest improvements are clearly seen to be the medium order products which do not fall away very quickly in the amplifier without feedback.

Figure 11:
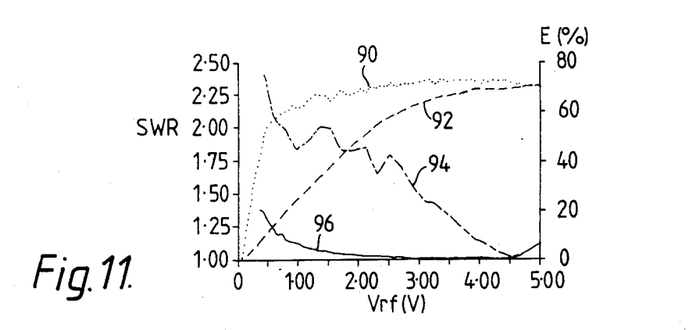
FIG. 11 is a graph of the amplifier input SWR (Standing Wave Ratio) and efficiency improvements with envelope feedback.

FIG. 11 illustrates two features the efficiency, E, and amplifier input SWR with R.F. drive voltage(Vrf). Considering efficiency first, the efficiency with feedback is shown in dotted lines 90 and without feedback is shown in broken lines 92. The improvement in efficiency can be more significant if a high efficiency power supply, such as a switched mode power supply, is used. The shape of the input waveform can also contribute to the improvement and those signals with the greatest peak to average ratio yield the most dramatic improvement.

Turning now to the variation of SWR with R.F. drive, the curve shown in the chain-dot line 94 shows the performance without feedback and that shown as a continuous line 96 illustrates the performance with feedback. Both curves have been optimised under high power performance.

Although embodiments of the invention have been described in which envelope feedback is used to control amplitude and phase distortions, it is also possible to use phase feedback. In that case a phase detector for detecting the difference in phase between the input and output of the R.F. amplifier is used instead of the diode detectors 36, 40. By sensing the magnitude and sign of the amplifier input reflections as is done by the components in the broken line box 25 (FIG. 5b) it is possible to derive the additional control signal which is used to adapt the feedback conditions of the amplifier system.

I claim:

1. A bipolar transistor R.F. power amplifier comprising a bipolar transistor having base and collector electrodes, an input circuit coupled to the base electrode and an output circuit coupled to the collector electrode, an adjustable collector voltage power supply coupled to said collector electrode, means for deriving a characteristic of an input signal in the input circuit, means for deriving the same type of characteristic of an output signal in the output circuit, and comparator means for comparing said corresponding characteristics of the input and output signals and providing a feedback control signal to the collector voltage power supply, wherein the collector voltage power supply is adapted to adjust said collector supply voltage so that the bipolar transistor operates in a mode where gain, phase shift and input impedance are simultaneously linearised, found at the onset of gain saturation in response to variations in input drive level;

further comprising means for sensing the magnitude and sign of the amplifier input reflections and means for deriving another control signal in response to the reflections sensed, said another control signal being used to adapt the feedback conditions of the amplifier; and wherein said sensing means comprises a directional coupler connected to the input circuit of the bipolar transistor, the directional coupler having forward and reflected ports which are coupled to respective inputs of a synchronous detector, the output signal from which is used to provide said another control signal.

2. A bipolar transistor R.F. power amplifier comprising a bipolar transistor having base and collector electrodes, an input circuit coupled to the base electrod and an output circuit coupled to the collector electrode, an adjustable collector voltage power supply coupled to said collector electrode, means for deriving a characteristic of an input signal in the input circuit, means for deriving the same type of characteristic of an output signal in the output circuit, and comparator means for comparing said corresponding characteristics of the input and output signals and providing a feedback control signal to the collector voltage power supply, wherein the collector voltage power supply is adapted to adjust said collector supply voltage so that the bipolar transistor operates in a mode where gain, phase shift and input impedance are simultaneously linearised, found at the onset of gain saturation in response to variations in input drive level;

wherein said means for deriving said characteristic of said input and output signals comprise amplitude detectors;

and wherein diode detectors are coupled to the input and attenuated output circuits of the bipolar transistor, outputs of the diode detectors are coupled to an amplifier whose output comprises the difference of the signals applied to the detectors and wherein the collector voltage power supply unit is connected to the amplifier unit to control the collector voltage in response to differences between the detected voltages.

3. An amplifier as claimed in claim 2, wherein the power supply unit is a switched mode power supply.

* * * * *